US007749665B2

(12) United States Patent
Kawamura et al.

(10) Patent No.: US 7,749,665 B2
(45) Date of Patent: Jul. 6, 2010

(54) METHOD OF GENERATING WRITING PATTERN, METHOD OF FORMING RESIST PATTERN, METHOD OF CONTROLLING EXPOSURE TOOL, AND METHOD OF MANUFACTURING SEMICONDUCTOR DEVICE

(75) Inventors: Daisuke Kawamura, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1426 days.

(21) Appl. No.: 11/108,751

(22) Filed: Apr. 19, 2005

(65) Prior Publication Data

US 2005/0248741 A1 Nov. 10, 2005

(30) Foreign Application Priority Data

Apr. 19, 2004 (JP) ............................ 2004-123372

(51) Int. Cl.
*G03F 9/00* (2006.01)

(52) U.S. Cl. ........................................................ 430/30

(58) Field of Classification Search .................. 430/30, 430/322, 311
See application file for complete search history.

(56) References Cited

U.S. PATENT DOCUMENTS 6,266,144 B1 * 7/2001 Li ............................. 356/401
2005/0179880 A1 * 8/2005 Butler et al. .................. 355/53

FOREIGN PATENT DOCUMENTS

JP 2003-186174 7/2003
WO WO 99/49504 9/1999
WO WO 99/49505 9/1999

OTHER PUBLICATIONS

English translation of JP Publication 2003-186174, Jul. 2003.*
Notification of Examination Opinion from the Taiwanese Intellectual Property Office, mailed Dec. 31, 2008, in Taiwanese Patent Application No. 094111860, and English translation thereof.

(Continued)

*Primary Examiner*—Kathleen Duda
*Assistant Examiner*—Brittany Raymond
(74) *Attorney, Agent, or Firm*—Finnegan, Henderson, Farabow, Garrett & Dunner, L.L.P.

(57) ABSTRACT

A method of generating a writing pattern is disclosed, which generates, from pattern data, writing pattern data to write a mask pattern in a photomask used in an exposure tool comprising a projection optical system to transfer the mask pattern to a resist film formed on a substrate, an immersion mechanism which forms a liquid film in a local region, and a movement mechanism which moves the substrate with respect to the projection optical system and the immersion mechanism, the method comprising obtaining a typical distribution of contact history values between the resist film and the liquid film in the unit exposure region, dividing a pattern which corresponds to the pattern data into a plurality of regions according to the typical distribution of the contact history values, and carrying out correction of a pattern included in each of the divided regions under a rule according to the contact history values.

18 Claims, 10 Drawing Sheets

OTHER PUBLICATIONS

Hinsberg et al., "Liquid Immersion Lithography—Evaluation of Resist Issues", Proceedings of SPIE, vol. 5376, pp. 21-33, (2004).
Taylor et al., "Implications of Immersion Lithography on 193nm Photoresists", Proceedings of SPIE, vol. 5376, pp. 34-43, (2004).
Vogt et al., "Measurements of Water Distribution in Thin Lithographic Films", Proceedings of SPIE, vol. 5376, pp. 56-62, (2004).
Kishimura et al., "Resist Interaction in 193-/157-nm Immersion Lithography", Proceedings of SPIE, vol. 5376, pp. 44-55, (2004).
Streefkerk et al., "Extending Optical Lithography With Immersion", Proceedings of SPIE, vol. 5377, pp. 285-305, (2004).
Owa et al., "Immersion Lithography; Its Potential Performance and Issues", Proceedings of SPIE, vol. 5040, pp. 724-733, (2004).

* cited by examiner

- ⊘ Four times
- ◨ Three times
- ◩ Two times
- ☐ One time

- ▨ Five times
- ⊘ Four times
- ◨ Three times
- ◩ Two times

- ▨ 80 to 100 seconds
- ⊘ 60 to 80 seconds
- ◨ 40 to 60 seconds
- ◩ 20 to 40 seconds

- ▨ 80 to 100 seconds
- ⊘ 60 to 80 seconds
- ◨ 40 to 60 seconds
- ◩ 20 to 40 seconds

METHOD OF GENERATING WRITING PATTERN, METHOD OF FORMING RESIST PATTERN, METHOD OF CONTROLLING EXPOSURE TOOL, AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-123372, filed Apr. 19, 2004, the entire contents of which are incorporated herein by reference.

BACKGROUND OF THE INVENTION

1. Field of the Invention

The present invention relates to a method of generating a writing pattern to write a mask pattern for use in immersion lithography, a method of forming a resist pattern by using immersion lithography, a method of controlling an exposure tool of immersion lithography type, and a method of manufacturing a semiconductor device.

2. Description of the Related Art

Development of an exposure tool has made a progress with pattern downsizing of a semiconductor device. As a next-generation lithography to 193 nm-"Dry"-lithography, a 157 nm-lithography has been developed. However the development of exposure tool and resist for 157 nm lithography is delayed. At this point in time, 193 nm immersion lithography attracts attention. In an immersion type exposure tool, a immersion medium fluid such as water has a greater refractive index than air is filled between an objective lens and a stacked resist films targeted for image focusing, thereby making it possible to increase a critical angle between the objective lens and the medium or between the medium and the stacked resist films. In addition, it is also possible to resolve a downsized pattern having a greater diffraction angle as an image by using a proper lens.

In 193 nm immersion lithography, the use of a pure water having a refractive index of 1.43 to 1.44 as the immersion medium fluid is discussed. In academy, there has been reported that water comes into contact with a stacked resist films, whereby a change relative to a resist shape occurs due to a change in composition distribution in a resist film caused by elution of a resist composition from among the resist film or water penetration into the resist film or the like. Specifically, a resist pattern is formed in a T-top shape. In order to solve this problem, there has been reported in the academy that a cover material film made of a resin is formed on the stacked resist films, thereby preventing elution of a photo acid generator (PAG) which is a resist composition, a photo generating acid, or a base into the water and infiltration of the water into a resist solvent. However, it is necessary to release the cover material film by using a special solvent as remover. Unlike a resist solvent generally used as the remover of cover material film, this special solvent is non-water soluble. Therefore, there is a need for a dedicated coating unit and/or a developing unit from the viewpoint of waste disposal. In a process for manufacturing a device such as a semiconductor, the use of the specific solvent results in a manufacturing cost. Thus, it is believed difficult to use the above cover material film of such type which requires a dedicated coating or developing unit. Therefore, it is desirable that an acid or alkali soluble cover material film exist which does not require a special remover unit. Further, it is more desirable that there exists a resist film material which does not require the cover material film, or alternatively, an additional resist process. In an acid or alkali soluble cover material film, it is an object to achieve the removeing by an acid or alkali soluble cover material film. Thus, water permeability is reliably lowered as compared with a cover material film requiring the special remover of cover material film. As a result, a certain counts of degree of immersion medium fluid penetrate into the inside of the resist film. Therefore, it is believed that there also occurs elution of the resist composition into water which is an immersion medium fluid.

As described above, in the case where a cover material film is not used from an aspect of a manufacturing cost in a lithography process using an immersion lithography device or in the case where a acid/base soluble cover material film is used, it is unavoidable to make a contact between the stacked resist films and the immersion medium fluid. According to patent document 1 and non-patent document 1, a practical immersion lithography tool has a function which selectively supplies an immersion medium fluid only onto stacked resist films in an exposure region (WO 99/49504; Soichi Owa and Hiroyuki Nagasaka, Immersion lithography; its potential performance and issues, Proc. of SPIE Vol. 5040, pp. 724 to 733).

BRIEF SUMMARY OF THE INVENTION

According to a first aspect of the present invention, there is provided a method of generating a writing pattern which generates, from pattern data, writing pattern data to write a mask pattern in a photomask used in an exposure tool comprising a projection optical system to transfer the mask pattern to a resist film formed on a substrate to form a latent image, an immersion mechanism which forms a liquid film of immersion medium fluid in a local region including a region between the final element of the projection optical system and the resist film, and a movement mechanism which moves the substrate with respect to the projection optical system and the immersion mechanism to transfer the mask pattern to a plurality of unit exposure regions set in the resist film, the method comprising:

obtaining a typical distribution of contact history values between the resist film and the liquid film of immersion medium fluid in the unit exposure region;

dividing a pattern which corresponds to the pattern data into a plurality of regions according to the typical distribution of the contact history values; and carrying out correction of a pattern included in each of the divided regions under a rule according to the contact history values.

According to a second aspect of the present invention, there is provided a method of forming a resist pattern, comprising:

transferring a mask pattern on a resist film formed on a substrate by using an exposure tool comprising a projection optical system to transfer the mask pattern to the resist film formed on the substrate, a first immersion mechanism which forms a liquid film in a local region including a region between the projection optical system and the resist film, and a stage which horizontally moves the substrate relatively with respect to the projection optical system and the first immersion mechanism to transfer the mask pattern to a plurality of unit exposure regions set in the resist film, the method including; and developing the resist film on which the mask pattern is transferred, wherein a correction is carried out on a distribution of contact history values between the resist film and the liquid film of immersion medium fluid in the unit exposure regions to be made substantially equal to distribution of contact history values in another unit exposure region.

According to a third aspect of the present invention, there is provided a method of forming a resist pattern, comprising:

transferring a mask pattern on a resist film formed on a substrate by using an exposure tool comprising a projection optical system to transfer the mask pattern to the resist film formed on the substrate, an immersion mechanism which forms a liquid film of immersion medium fluid in a local region including a region between the projection optical system and the resist film, and a stage which horizontally moves the substrate relatively with respect to the projection optical system and the immersion mechanism to transfer the mask pattern to a plurality of unit exposure regions set in the resist film; and developing the resist film on which the mask pattern is transferred, wherein, with regard to a unit exposure region whose number of unit exposure regions adjacent to the unit exposure region is a value other than a maximum value, a virtual unit exposure region is set so that the number of the adjacent unit exposure regions becomes the maximum value; and the liquid film is formed on the virtual unit exposure region by using the first immersion mechanism, without transferring the mask pattern onto virtual unit exposure region.

According to a fourth aspect of the present invention, there is provided a method of controlling an exposure tool, comprising:

transferring a mask pattern on a resist film formed on a substrate by using an exposure tool comprising a projection optical system to transfer the mask pattern to the resist film formed on the substrate, an immersion mechanism which forms a liquid film of immersion medium fluid in a local region including a region between the projection optical system and the resist film, and a stage which horizontally moves the substrate relatively with respect to the projection optical system and the immersion mechanism to transfer the mask pattern to a plurality of unit exposure regions set in the resist film; and developing the resist film on which the mask pattern is transferred, wherein, with regard to a unit exposure region whose number of unit exposure regions adjacent to the unit exposure region is a value other than a maximum value, a virtual unit exposure region is set so that the number of the adjacent unit exposure regions becomes the maximum value; and order of movement of the immersion mechanism with respect to the substrate is determined according to the unit exposure region and a virtual unit exposure region.

According to a fifth aspect of the present invention, there is provided a method of manufacturing a semiconductor device, comprising:

forming a photo mask based on a writing pattern generated by using the method of generating a writing pattern, as claimed in the first aspect; and transferring a mask pattern formed on the photo mask on a resist film formed on a semiconductor substrate to form a latent image.

According to a sixth aspect of the present invention, there is provided a method of manufacturing a semiconductor device, comprising:

transferring a mask pattern formed on a photo mask on a resist film formed on a semiconductor substrate by using the method of forming a resist pattern, as claimed in second aspect, to form a latent image.

According to a seventh aspect of the present invention, there is provided a method of manufacturing a semiconductor device, comprising:

transferring a mask pattern formed on a photo mask on a resist film formed on a semiconductor substrate by using the method of forming a resist pattern, as claimed in third aspect, to form a latent image.

According to an eighth aspect of the present invention, there is provided a method of manufacturing a semiconductor device, comprising:

transferring a mask pattern formed on a photo mask on a resist film formed on a semiconductor substrate by using the method of controlling an exposure tool, as claimed in the fourth aspect, to form a latent image.

DETAILED DESCRIPTION OF THE INVENTION

Embodiments of the present invention will be described with reference to the accompanying drawings below.

FIRST EMBODIMENT

An antireflection film is formed on a substrate if required. Then, a resist film is formed on the antireflection film. Further, an upper layer antireflection film or a protection firm is formed on the resist film if required. Furthermore, by using an immersion lithography device, a projection image is formed on the resist film by exposure via a pattern on a photomask. Then, heating is carried out after the exposure if required, and a resist pattern is formed by developing the projection image.

The above-described immersion lithography device is provided as a scan and repeat type exposure tool having a mechanism which moves the photomask and the substrate by moving the photomask and the substrate altogether so that the projection image for a stacked resist films via the photomask is set at a predetermined position on a film plane. Further, this exposure tool has a structure in which a mechanism to carry out immersion lithography has been added.

Figure 1:
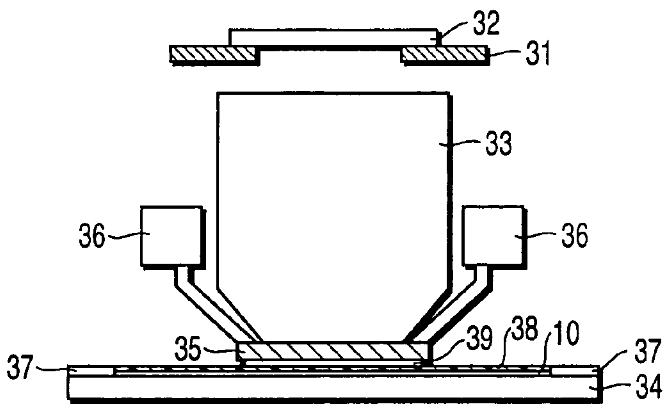
FIG. 1 is a view showing a general configuration of an exposure tool according to a first embodiment of the invention.

FIG. 1 shows an outline of the exposure tool. FIG. 1 is a view showing a general configuration of the exposure tool according to a first embodiment of the present invention. A reticle stage 31 is laid out downwardly of an illumination optical system (not shown). A reticle 32 which is the photomask is placed on the reticle stage 31. This reticle stage 31 can be moved in parallel. A projection lens system 33 is laid out downwardly of the reticle stage 31. A wafer stage 34 is laid out downwardly of the projection lens system 33. A semiconductor substrate 10 for which the processing described previously has been carried out is placed on the wafer stage 34. The wafer stage 34 moves in parallel together with the semiconductor substrate 10. A support plate 37 is provided around the semiconductor substrate 10.

A showerhead 35 is mounted downwardly of the projection lens system 33. A showerhead 35 did not contact directory with a substrate 10, there has a little gap. A pair of water supply and discharge devices 36 which supplies water into the showerhead 35 and discharges water from the side of showerhead 35 is provided laterally of the projection lens system 33. During exposure, a space between the substrate 10 and the projection lens system 33 in a region enclosed with the showerhead 35 and the projection lens 33 is filled with a water liquid film 39. The exposure light emitted from the projection lens system 33 passes through the water liquid film 39, and reaches an irradiation region. An image of a mask pattern (not shown) on the reticle 32 is projected to a photo resist 38 of the substrate surface which comes under the irradiation region, and a latent image is formed.

In the step and scan type exposure tool, all the patterns on the photomask are not integrally transferred to the stacked resist films. Only the patterns in a predetermined slit shape area referred to as an exposure field on the photomask, the predetermined slit-shaped range being smaller than the entire pattern plane of the photomask. An exposure is carried out in a state where the photomask and the substrate have moved altogether at a rate according to a magnification of a projection optical system. Whereby, the photomask and the substrate are scanned by light ray, and all the patterns in the predetermined range on the photomask is projected onto the stacked resist films. In addition, a term called the exposure field may mean the predetermined area of a slit shape on a substrate plane which is optically conjugate with the pattern side on a photomask.

Relative moving directions of the photomask and the substrate are generally opposed to each other between the unit exposure regions in which the exposure sequence is continuous in order to reduce an exposure processing time by reducing the movement count of the photomask.

It is also possible to limit a pattern region on the photomask by using a field stop referred to as a mask blind. A region of a latent image formed on the stacked resist films which corresponds to the mask pattern on the photomask, i.e., a unit exposure region is generally referred to as an exposure shot or the like.

The irradiation energy of exposure light is determined depending on a relative movement speed and intensity of a light source. Thus, assistant movement for acceleration and deceleration is required for the relative movements of the photomask and the substrate in order to make uniform the exposure quantity in the unit exposure region.

A relative movement in immersion lithography will now be described with reference to FIG. 2. Although the substrate moves in actuality, the following description will be given assuming that the exposure field moves with the substrate being a reference.

Figure 2:
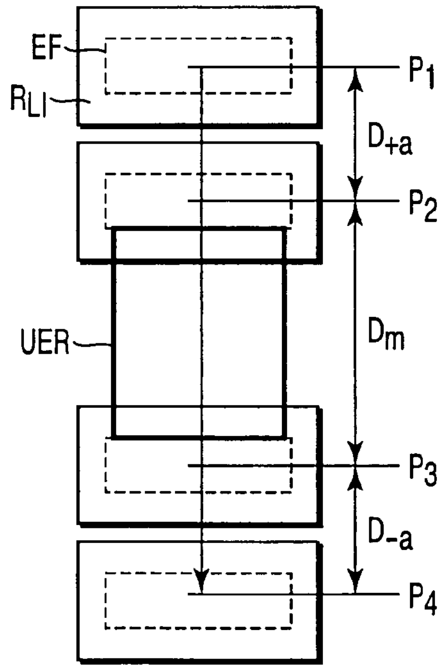
FIG. 2 is a view adopted to explain relative movement between an exposure field and a unit exposure region.

As shown in FIG. 2, an exposure field EF starts moving from a position $P_1$. A position is defined as $P_2$ when one end of a unit exposure region UER of the exposure field EF comes into contact with one end of another unit exposure region UER. The speed of the exposure field EF is accelerated to a predetermined speed between the position $P_1$ and the position $P_2$. A distance between these positions is defined as $D_{+a}$. Then, while the other end of the exposure field EF reaches a position $P_3$ which comes into contact with the other end of the unit exposure region UER, the exposure field EF moves at a constant speed. At this interval, a mask pattern is transferred to a resist film, and a latent image is formed in the resist film. A distance of this interval is defined as $D_m$. Then, at the position $P_3$ and subsequent, the exposure field EF decelerates, and stops at a position $P_4$. A distance between the position $P_3$ and the position $P_4$ is defined as $D_{-a}$. The above-described distance $D_m$ is obtained as a sum between the distance $D_{+a}$ and the distance $D_{-a}$. In FIG. 2, reference code $R_{LI}$ denotes a region in which a liquid film is formed by an immersion medium fluid. In this figure, the region of liquid film was assumed as rectangular.

In addition, the unit exposure region is generally laid out on the substrate at a predetermined interval in orthogonal two axial directions, and an layout interval of the unit exposure regions is approximately equal to a length in each of the axial directions of the unit exposure region. The relative moving direction of each of the substrate and the photomask is defined as a Y-axis, and a vertical direction on a substrate plane is defined as an X-axis.

A region in which the immersion medium fluid is formed on a stacked resist films by means of a mechanism of supplying the immersion medium fluid must be greater than the exposure field in area for the purpose of immersion lithography.

Thus, due to the formation of a latent image in a unit exposure region adjacent a predetermined unit exposure region in the X direction, an additional contact between the immersion medium fluid and the stacked resist films occurs in the vicinity of the adjacent unit exposure region in the target exposure region. In addition, due to assistant movement of acceleration or deceleration of the adjacent unit exposure region in the Y direction, an additional contact between the immersion medium fluid and the stacked resist films occurs in the vicinity of the adjacent unit exposure region in the target exposure region. Further, it is necessary to move the substrate to a proper position of a next unit exposure region after the latent image in the unit exposure region has been formed. As a result, a further contact between the immersion medium fluid and the stacked resist films occurs.

As described above, a distribution occurs with a history of contacts between the immersion medium fluid and the stacked resist films in the unit exposure region.

In immersion lithography, there is concern about a composition distribution change in the stacked resist films caused by infiltration of the immersion medium fluid into the stacked resist films; an occurrence of a three-dimensional resist shape change caused by elution of the resist composition into the immersion medium fluid and reattachment of the stacked resist films of the eluted composition to a different position or the like; or a distribution of shape.

As a result, in immersion lithography, there is a concern about a change of a resist shape or a distribution of the shape change caused by the contact history between the immersion medium fluid and the stacked resist films in the unit exposure region.

In the case where a photomask whose pattern data has been corrected by the same correction quantity is used regardless of a position on a photomask, it is believed that a dimensional change of a resist pattern derived from the contact history between the immersion medium fluid and the stacked resist films in the unit exposure region or a transfer pattern from the resist pattern to the substrate occurs in the unit exposure region.

Figure 3:
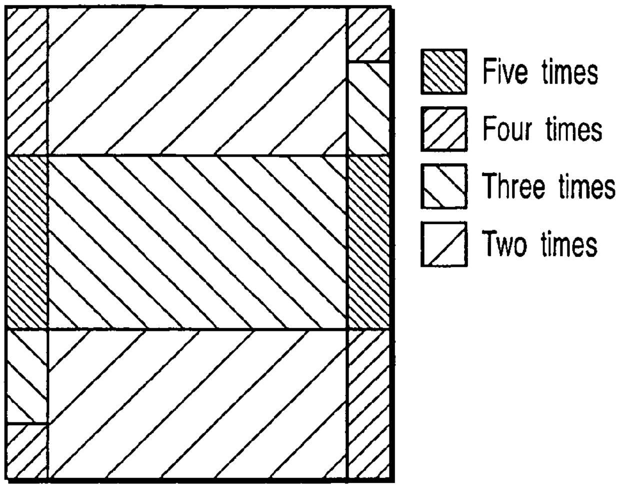
FIG. 3 is a shot map showing a distribution in contact count between an immersion medium fluid and a stacked resist films in a predetermined unit exposure region.

As an example, there is shown a distribution of the contact count between the immersion medium fluid and the stacked resist films in a predetermined unit exposure region in the case where an exposure field is rectangular and in the case where a region in which a immersion medium fluid is formed on the stacked resist films is also rectangular (FIG. 3).

An example of means for restricting a pattern dimensional change which occurs in the unit exposure region, described above, will be described below in more detail. In the present embodiment, a region in an exposure shot is divided in accordance with a contact history of the immersion medium fluid in the unit exposure region, and a writing pattern of a photomask which corresponds to each divided region is corrected under a rule which is different depending on the history of a contact with the above immersion medium fluid.

Figure 4:
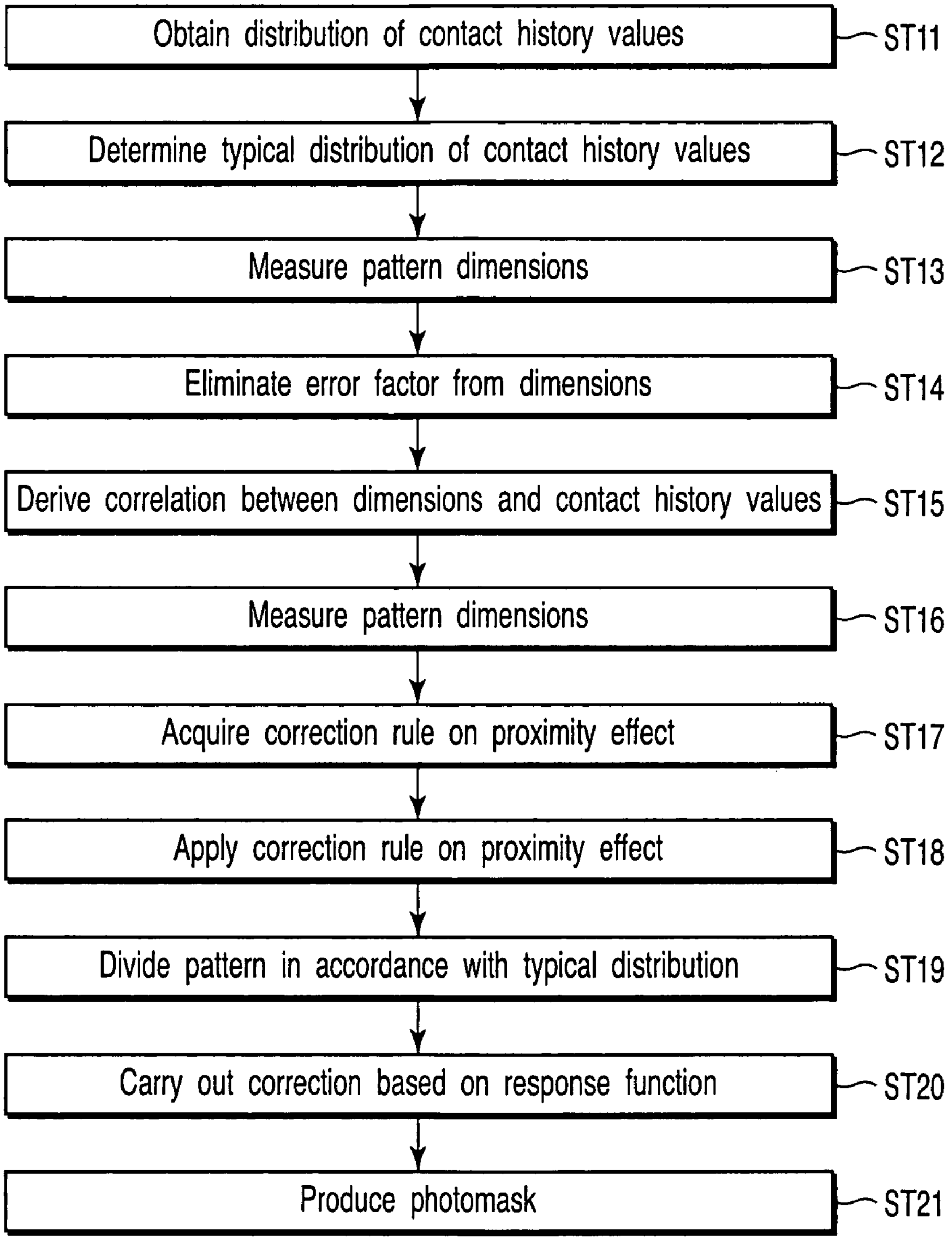
FIG. 4 is a flow chart showing operating procedures in a method for generating a writing pattern according to the first embodiment.

FIG. 4 is a flow chart showing operating procedures in a method for generating a writing pattern according to the first embodiment of the present invention.

A contact history value distribution relative to an immersion medium fluid and a stacked resist films is obtained with respect to each unit exposure region of the stacked resist films (step ST11). The contact history values used here include at least one item of information such as: a time of contact between the immersion medium fluid and the stacked resist films; the count of contact between the immersion medium fluid and the resist film; a quantity of the immersion medium fluid; an impulse applied to a resist film surface in accordance with the flow of the immersion medium fluid; and a maximum frictional force of a surface of the stacked resist films with respect to the immersion medium fluid.

A typical contact history value distribution for correcting pattern data is determined from the obtained distribution of the plurality of contact history values (step ST12).

Figure 5:
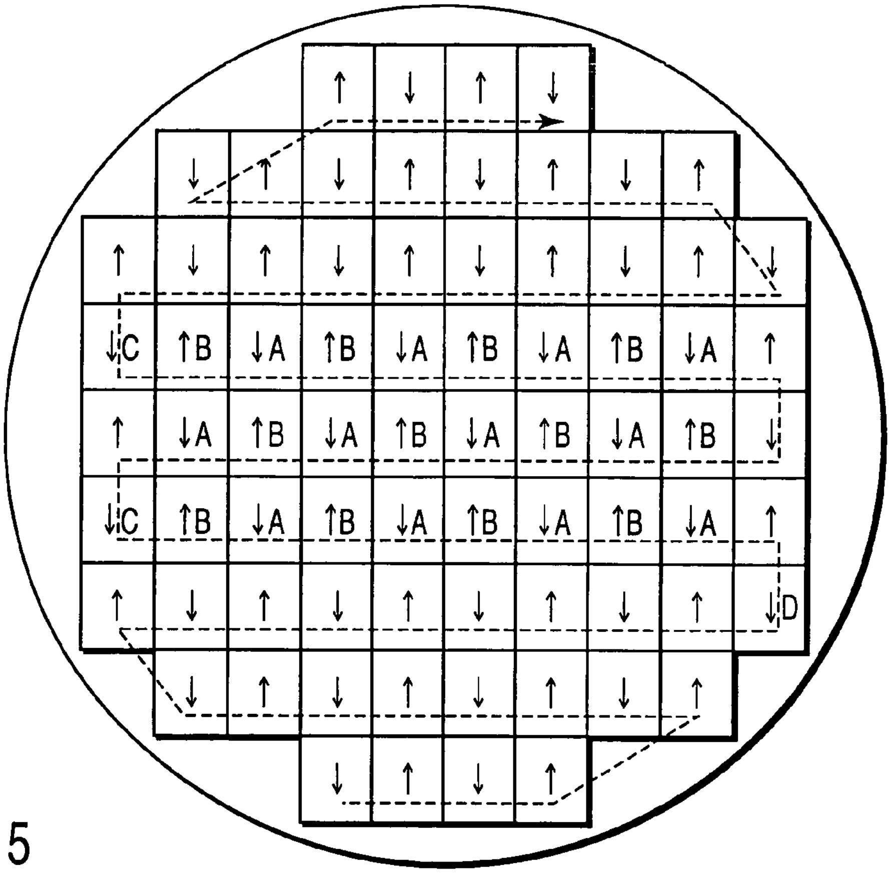
FIG. 5 is a shot map showing a unit exposure region on a wafer, an exposure sequence of the unit exposure region, and a moving direction of an exposure field.
Figure 6:
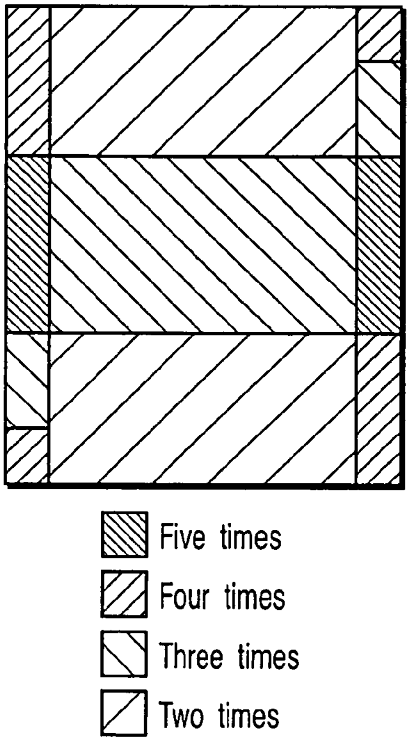
FIG. 6 is a view showing a distribution in contact count between an immersion medium fluid and a stacked resist films in the unit exposure region A shown in FIG. 5.
Figure 7:
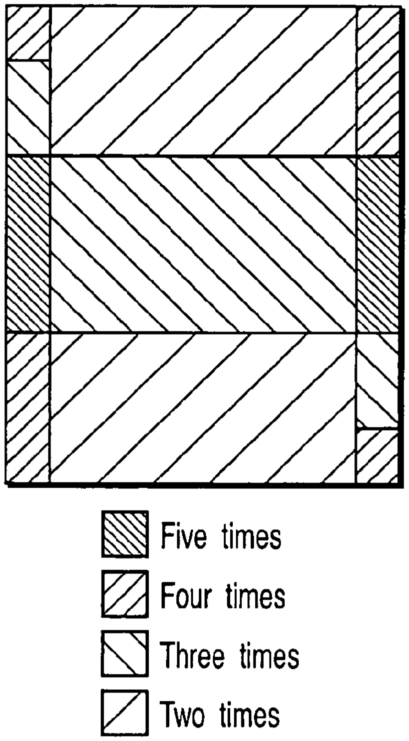
FIG. 7 is a view showing a distribution in contact count between an immersion medium fluid and a stacked resist films in the unit exposure region B shown in FIG. 5.
Figure 8:
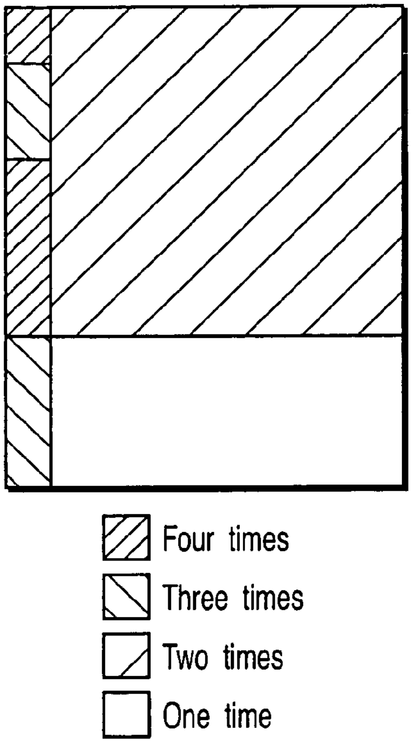
FIG. 8 is a view showing a distribution in contact count between an immersion medium fluid and a stacked resist films in the unit exposure region C shown in FIG. 5.
Figure 9:
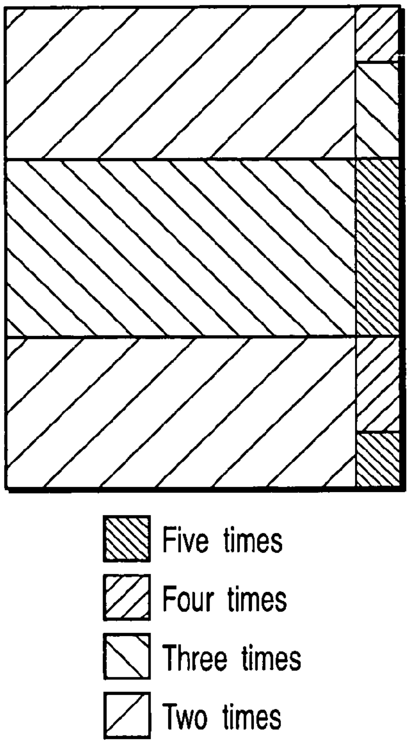
FIG. 9 is a view showing a distribution in contact count between an immersion medium fluid and a stacked resist films in the unit exposure region D shown in FIG. 5.

Let us consider a layout of a unit exposure region shown in FIG. 5. In FIG. 5, a rectangle denotes a unit exposure region; a dotted line arrow denotes an exposure sequence of the unit exposure region; and an arrow enclosed in the rectangle denotes a moving direction of an exposure field. FIGS. 6 to 9 each show a contact count distribution relative to the immersion medium fluid and the stacked resist films which is one of the histories of contact between the immersion medium fluid and the stacked resist films inside each of the unit exposure regions A, B, C, and D shown in FIG. 5.

In the region A (FIG. 6), all the adjacent unit exposure regions are free of defect. In the region B (FIG. 7), a contact count distribution is obtained as a vertically axisymmetrical distribution. However, in the region C, the adjacent unit exposure regions in the Y direction (FIG. 8) are defected; and in the region D (FIG. 9), the adjacent unit exposure regions in the X and Y directions and an oblique direction are defected. In these two regions, a distribution of the contact counts inside the unit exposure region is greatly different from another one. Thus, in the unit exposure region in which the adjacent unit exposure regions are defected, it is believed that a difference occurs in a resist pattern shape distribution from a unit exposure region in which the adjacent unit exposure regions are free of a defect.

Figure 10:
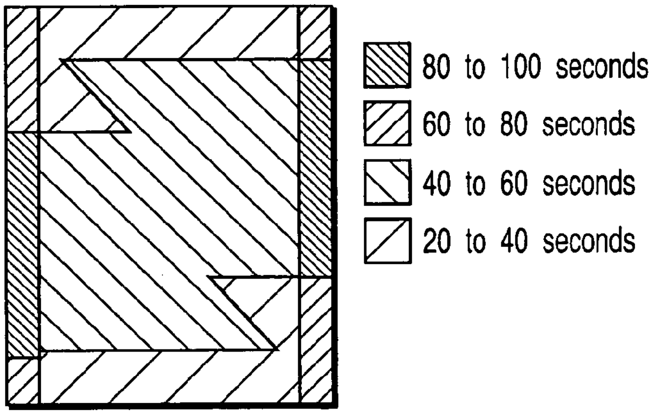
FIG. 10 is a view showing a distribution in contact time between the immersion medium fluid and the stacked resist films in the unit exposure region A shown in FIG. 5.
Figure 11:
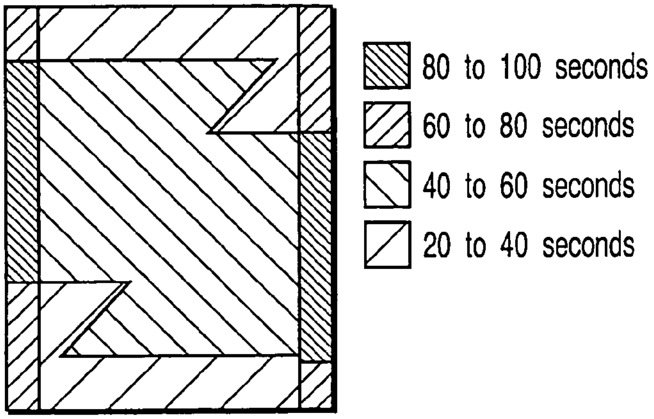
FIG. 11 is a view showing a distribution in contact time between the immersion medium fluid and the stacked resist films in the unit exposure region B shown in FIG. 5.

FIGS. 10 and 11 each show a contact time distribution instead of the count of contact between the immersion medium fluid and the stacked resist films shown in FIGS. 6 to 9. These two figures each show a contact time distribution in two unit exposure regions A (FIG. 10) and B (FIG. 11) in which the photomask moving directions are opposite to each other, although there is no defect in any of the adjacent unit exposure regions shown in FIG. 5. Here, for the sake of simplification, there is shown an outline in which all the substrate movement due to the formation of a latent image to the target unit exposure region, assistant substrate movement for the acceleration and deceleration, and substrate movement for moving to the adjacent unit exposure region are made at a constant speed. The exposure time is defined as a normalized value.

Unlike the contact count, the contact time distribution is obtained as a horizontally symmetrical distribution in a unit exposure region free of a defect in the adjacent unit exposure regions.

As shown in FIGS. 6 to 9, 10 and 11, the contact history distribution is different depending on the unit exposure region. In order to generate a writing pattern formed on a photomask, it is necessary to obtain a typical contact history distribution and correct pattern data according to such typical distribution. Methods for obtaining the typical distribution will be described later.

Next, by using immersion lithography, the pattern is transferred to each of the unit exposure regions set in the stacked resist films, and dimensions of the transferred pattern are obtained (step ST13). In this step, measurement of dimension is carried out within each of the unit exposure regions which are different from each other in the previously obtained distribution of the contact history values. Further, measurement of dimension is carried out within each of the regions which are different from each other in the contact history values in the unit exposure region. In this measurement, dimensions of a latent image formed in the resist film by a pattern transfer may be measured, and dimensions of a resist pattern after developed may be measured.

At this time, as a photomask, it is desirable to use a first test photomask on which a plurality of identical patterns has been laid out. In addition, a resist pattern is used as a mask if required, and a lower film is etched, whereby dimensions of the patterns formed in the lower film may be measured.

Next, error factors such as a pattern dimension distribution on the first test photomask and an irradiation exposure distribution or the like are eliminated from pattern dimensions in the unit exposure region (step ST14). For example, a change rate caused by error of mask dimensions is corrected by using lithography simulation.

Next, a correlation between the corrected pattern dimensions in the unit exposure region and a plurality of contact history values relative to the immersion medium fluid and the stacked resist films is checked (step ST15). Based on this correlation, a response function between the contact history values and the dimensions which become factors of the pattern dimension distribution is determined.

Next, a pattern formed on a second test photomask is transferred to a resist film, and dimensions of a pattern are measured, the pattern being included in a region in which the contact history value is obtained as a specific value (step ST16). From the measured dimensions, an optical proximity-effect correction rule or a process proximity-effect correction rule are acquired (step ST17).

Next, the typical dimensions and the thus acquired correction rules are applied to pattern data to be formed, and first correction pattern data is obtained (step ST18).

Next, a pattern corresponding to the first correction pattern data is divided into a plurality of regions in accordance with the typical distribution of the contact history values (step ST19).

The pattern included in each of the divided regions is corrected based on the above-described response function, and second correction pattern data is obtained (step ST20).

Next, a pattern is written on a blanks substrate based on the second correction pattern data, and a photomask is produced (step ST21).

By using the photomask, a pattern dimension change in the unit exposure region is reduced, making it possible to improve the yield and performance of elements to be produced.

In the description of the present embodiment, although correction relative to an arbitrary item of data is described by dividing it into optical or process proximity-effect correction and correction according to the history values, continuous processing is desirable.

Although a different pattern may be formed on each of the first test photomask and the second test photomask, the same pattern is desirable in consideration of the cost of forming photomasks and a data acquisition time. It is desirable that a plurality of pattern types be provided to obtain a dimensional distribution in a unit exposure region used in the first and second processes. There is a possibility that the response function described in the third process is different depending on each pattern type if required. For example, the response function is different depending on a dense pattern and an isolating pattern or the like. The elimination of the error factors in the second process is not always mandatory, and may be omitted based on a proper method such as integration of the number of samplings.

In addition, in data correction of a plurality of photomasks using the same resist process, it is possible to omit a proper one of the processes in steps ST11 to ST17.

In addition, in step ST17, the rule for carrying out proximity-effect correction with respect to a portion at which a contact history value exists has been obtained. However, a rule for carrying out proximity-effect correction in accordance with the contact history values may be obtained.

(Method A for Obtaining Typical Distribution)

As described above, in the unit exposure region positioned at the end part in the substrate layout, there is a difference in a unit exposure region free of a defect of the adjacent unit exposure region and a contact history between an immersion medium fluid and a stacked resist films. A description will be given with respect to a method for determining a typical contact history distribution in the unit exposure region in such a case.

The present embodiment describes a method adopted to a contact history value "p" and a response of the response function f(p) which become factors of a pattern dimension change.

A correlation with the contact histories in all the unit exposure regions laid out at their predetermined positions on a substrate will be summarized as a distribution of the contact histories for each coordinate in the unit exposure region.

Let us consider a first order differentiation f'(p) and a second order differentiation f"(p) of the response function f(p).

In the case where $f' \times f'' < 0$, a dimensional change in a region in which the contact history value "p" is small is drastic. In this case, in an arbitrary coordinate in the unit exposure region, an error of a dimensional change rate is small even if the contact history value "p" is equal to or greater than a dimensional change rate "f" of a minimum value of the contact history which can be taken in the above coordinate as long as correction is made in accordance with the above dimensional change rate. In this case, as a correction quantity relative to a minimum value $p_{min}$ of an arbitrary contact history, it is desirable that correction be made in accordance with $f(p_{min}+\Delta p)$ obtained by adding a proper increment which is $\Delta p>0$ instead of correction according to $f(p_{min})$.

In contrast, in the case where $f' \times f'' > 0$, a dimensional change in a region in which the contact history value "p" is great is drastic. In this case, in an arbitrary coordinate in the unit exposure region, an error of a dimensional change rate is small even if the contact history value “p” is equal to or smaller than a dimensional change rate “f” of a maximum value of the contact history which can be taken in the above coordinate as long as correction is made in accordance with the above dimensional change rate. In this case, as a correction quantity relative to a maximum value $p_{max}$ of an arbitrary contact history, it is desirable that correction be made in accordance with $f(p_{max}-\Delta p)$ obtained by subtracting a proper increment which is $\Delta p>0$ instead of correction according to $f(p_{max})$.

In the case where f'=0, that is, in the case where a dimensional change relative to the contact history monotonously increases or monotonously decreases, in an arbitrary coordinate in the unit exposure region, correction based on an average value of the contact history values which can be taken in the coordinate is carried out, thereby making it possible to obtain the maximum correction effect.

(Method B for Obtaining Typical Distribution)

This section describes methods adopted to obtain sufficient correction effect in many more unit exposure regions in the layout of the unit exposure regions on a substrate plane. There are three methods adopted to obtain the sufficient correction effect.

According to a first method, a correlation with the contact histories in all the unit exposure regions laid out at their predetermined positions on a substrate is summarized as a distribution of the contact histories for each coordinate in the unit exposure region. A distribution in which an average value of the contact history values which can be taken in the coordinate is defined as a typical value in the coordinate is obtained as the typical distribution. In this case, a correction effect according to a distribution frequency of the contact histories in the unit exposure region can be obtained with respect to all the unit exposure regions.

According to a second method, a distribution of the contact histories in each of all the unit exposure regions laid out at their predetermined positions on a substrate is compared with another one, and a distribution in which the number of unit exposure regions being the same distribution is maximum is defined as a typical distribution. The frequencies of a plurality of distributions may be equal to each other depending on type of contact history. In this case, an average distribution of a plurality of distributions whose frequencies are equal to each other is used as a typical distribution. In addition, in the case where the frequencies are substantially equal to each other, an average distribution of distributions having top four frequencies or an average distribution considering a frequency is used as a typical distribution. As a result, it becomes possible to obtain substantially proper correction effect with respect to many more unit exposure regions.

According to a third method, in the unit exposure regions laid out at their predetermined positions on a substrate, the contact history of a unit exposure region free of a defect in the adjacent unit exposure regions is used as a typical distribution. In this case, two or four types of distributions may exist depending on type of contact history. In this case, this method uses an average distribution of the two or four types of distributions or an average distribution considering a frequency of the plurality of distributions as a typical distribution. As a result, it becomes possible to obtain substantially proper correction effect with respect to many more unit exposure regions.

The second and third methods described previously are substantially almost identical to each other. In addition, higher correction effect can be obtained by combining them with methods shown in a second embodiment described later.

(Setting Acceleration Distance and Deceleration Distance)

The distribution of the contact times shown in each of FIGS. 10 and 11 has been obtained as a horizontally axisymmetrical distribution. However, by adjusting the acceleration distance and the deceleration distance, it is possible to make identical the contact time distribution between the immersion medium fluid and the stacked resist films which is one of the contact histories between the immersion medium fluid and the stacked resist films in the unit exposure regions A and B shown in FIG. 5.

Figure 12:
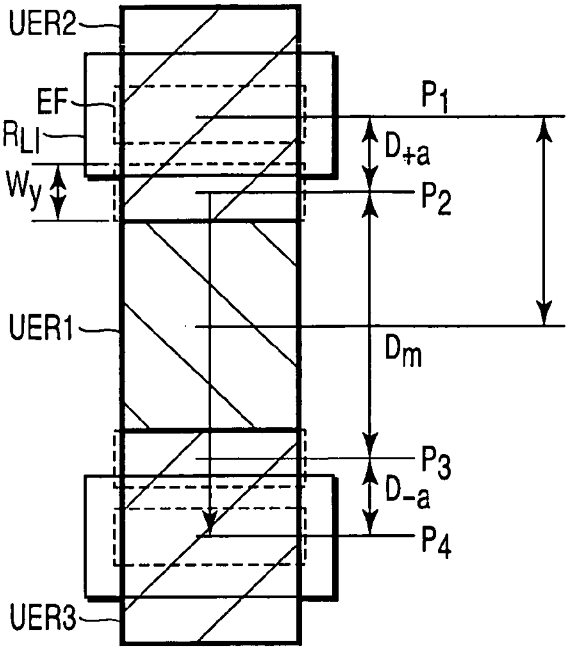
FIG. 12 is a view adopted to explain a distance suitable to an acceleration distance and a deceleration distance relative to a unit exposure region.
Figure 13:
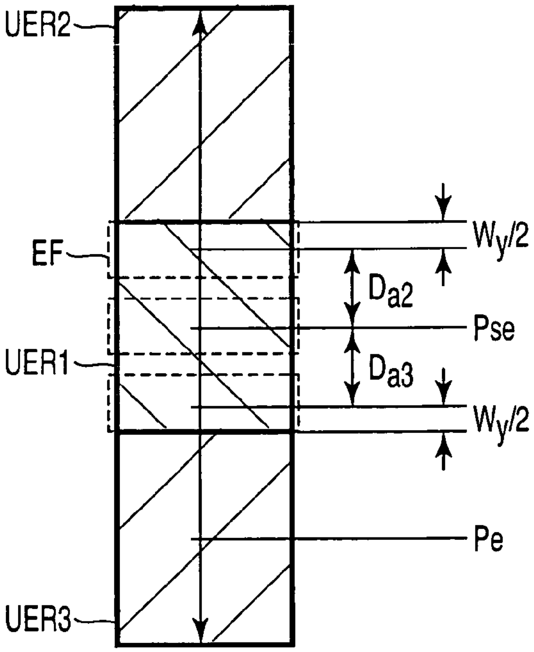
FIG. 13 is a view adopted to explain a distance suitable to an acceleration distance and a deceleration distance relative to a unit exposure region.

As shown in FIG. 12, a sum of acceleration distance $d_{+a}$, deceleration distance $d_{-a}$, and width $W_y$ in a y direction of an exposure field is made equal to a layout interval P in a relative direction of the unit exposure regions. As shown in FIG. 13, in the case where a mask pattern is transferred to the adjacent unit exposure regions UER2, UER3, an exposure field EF passes through the full face of the unit exposure region UER 1 in consideration of the acceleration or deceleration distance $d_2$, $d_3$.

Figure 14:
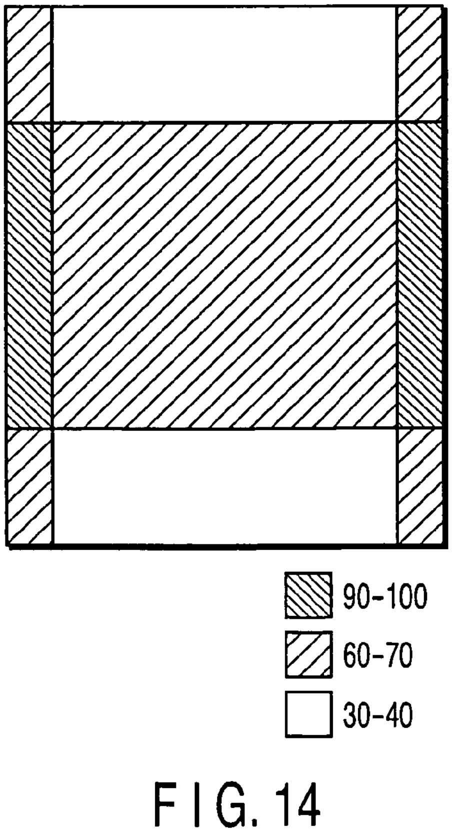
FIG. 14 is a view showing a distribution in contact time between the immersion medium fluid and the stacked resist films in the unit exposure region A shown in FIG. 5.
Figure 15:
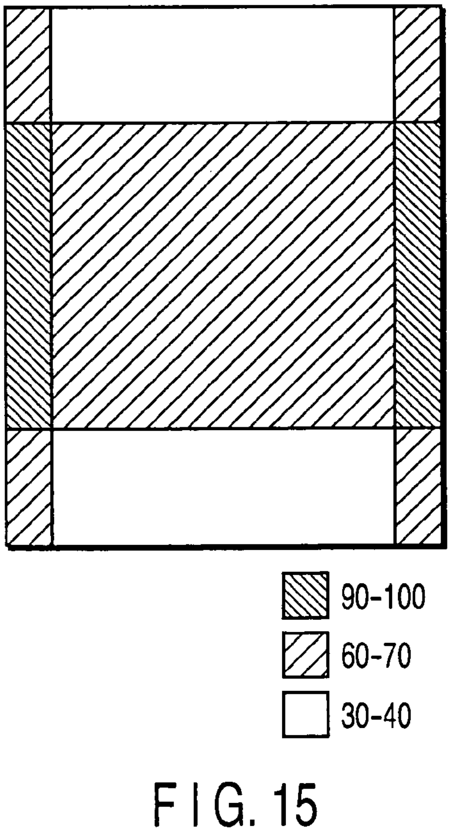
FIG. 15 is a view showing a distribution in contact time between the immersion medium fluid and the stacked resist films in the unit exposure region B shown in FIG. 5.

FIGS. 14 and 15 each show a contact time distribution between the immersion medium fluid and the stacked resist films in the unit exposure regions A, B shown in FIG. 5. FIG. 14 shows a contact time distribution between the immersion medium fluid and the stacked resist films in the unit exposure region A, and FIG. 15 shows a contact time distribution between the immersion medium fluid and the stacked resist films in the unit exposure region B. As shown in FIGS. 14 and 15, the contact time distributions in the unit exposure regions A, B are identical to each other.

Therefore, the number of distributions of different contact history times is reduced, making it easy to obtain a typical distribution of the contact history times.

(Contact History Value)

A description will now be given here with respect to a physical quantity in consideration of a contact history value between an immersion medium fluid and a stacked resist films which are believed to be a factor of a pattern dimension change in a unit exposure region.

In immersion lithography, a resist pattern shape is changed by a contact between the immersion medium fluid and the stacked resist films. The resist pattern shape change is modeled to be caused by phenomena such as: a composition distribution change in the resist film due to penetration and diffusion of an immersion medium fluid into the stacked resist films; a composition distribution change in the resist film due to the elution of a composition from the inside of the resist film to the immersion medium fluid; adsorption and/or intake of the eluted composition into the resist film; an optical constant change of the immersion medium fluid which is an optical path due to the eluted composition and a change in flare quantity due to generation of air bubbles; or a resist surface state change due to drying of the immersion medium fluid.

It is believed that the above causing phenomena are changed by a resist process including a change of film material process or relative movement of a water flow state of the immersion medium fluid and the like.

However, it is difficult to specify a main factor of the above phenomena or to comprehensively and quantitatively describe the phenomena, and then, as a result of the description, quantitatively describing the pattern dimension change rate. In particular, it is difficult to quantitatively express contribution of a material such as a resist film.

Therefore, it is believed effective to make a phenomenological analysis on the assumption that a change in the resist shape occurs due to the physical quantity with reference to the physical quantity which can be observably or analytically computed, the physical quantity being changed by movement of the substrate with stacked resist films. The physical quantities which are assumed to change the resist pattern shape can include: a contact time between the immersion medium fluid and the stacked resist films; a contact count between the immersion medium fluid and the stacked resist films; a quantity of the immersion medium fluid which passes through a target interest point in the unit exposure region; an impulse applied to a surface of the stacked resist films by a flow or the like of the immersion medium fluid in the unit exposure region; and a maximum frictional force between the surface of the stacked resist films and the immersion medium fluid in the unit exposure region.

Many of the currently used ArF resists each use a methacrylate or acrylate resin or a copolymeric resin made of maleic anhydride and norbornene as a base resin. In these resins, unlike a KrF resist using polyhydroxy styrene as a base resin, it is believed that energy movement from the resist to photo acid generator (PAG) hardly occurs. Therefore, a photo generating acid is generated only by projection light being absorbed by the PAG, and thus, a quantity of the photo generation acid changes depending on a quantity of the PAG during exposure.

Photo generating efficiency relative to an exposure quantity E from the PAG is defined as C. At this time, assume that an elution rate per a unit time of the PAG and photo generating acid into immersion medium fluid caused by a contact with the stacked resist films in the immersion medium fluid is equal to another at "a". Assume that region 1 is exposed after contact with the immersion medium fluid for time "t" and region 2 comes into contact with the immersion medium fluid for time "t" after exposure. At this time, a final photo generating acid quantity relative to an initial PAG quantity is equal to another at $\{1-\exp(-CE)\}\{1-\exp(-at)\}$. However, the target exposure quantity E depends on permeability of the upper layered resist film. The exposure quantity E changes depending on whether a contact with the immersion medium fluid is made before or after exposure at the lower resist film except that a total of permeability of the PAG and permeability of the photo generating acid and counter cation derived from the generator is equal to that of the upper layered resist film. Further, in an academic report (W. Hinsherg et al, 2004 SPIE Microlithography, Reprints No. 5376-03, C. L. Soles et al, 2004 SPIE Microlithography, Reprints No. 5376-06), it has been disclosed that an elution rate of photo generating acid is greater than that of the PAG. Therefore, it is believed that an amount of the photo generating acid which normalizes a deprotection reaction quantity of a resist resin may change depending on whether a contact between the immersion medium fluid and the stacked resist films is made before or after the exposure.

In addition, in the case where an elution rate in the immersion medium fluid between the photo generating acid and a quencher is significantly different from another, an amount of the photo generating acid in the remaining resist film without being trapped by the quencher changes depending on whether a contact between the immersion medium fluid and the stacked resist films is made before or after the exposure.

The elution rate in immersion medium fluid of the photo generating acid and the quencher may change depending on: an impulse between a surface of the stacked resist films and the immersion medium fluid in the unit exposure region; and a maximum frictional force between the surface of the stacked resist films and the immersion medium fluid in the unit exposure region. As described above, it is believed that, depending on type of resist film, a contact between the stacked resist films and the immersion medium fluid have a great effect on the elution rate before or after the exposure.

SECOND EMBODIMENT

As has been described previously, a unit exposure region positioned at the periphery in a predetermined layout on a substrate is such that a contact history distribution between an immersion medium fluid and a stacked resist films in the unit exposure region free of a defect in the adjacent unit exposure region changes due to a defect in the adjacent unit exposure regions. A immersion medium fluid which is substantially identical to the immersion medium fluid are additionally brought into contact with a stacked resist films in a region whose inside is different from that of another unit exposure region in the contact history distribution, thereby making it possible to compensate for the change in the contact history distribution. As a result, in the layout on the substrate, it becomes possible to ensure that a dimensional distribution in the unit exposure region positioned at the periphery is substantially identical to that of the unit exposure region free of a defect in the adjacent unit exposure region.

Methods according to the present embodiment are combined with those according to the first embodiment, thereby making it possible to attain the advantageous effect according to the first embodiment with respect to many more unit exposure regions.

Now, three specific methods according to the present embodiment will be described here.

According to a first method, a second immersion mechanism which selectively brings only a predetermined region of a stacked resist films on a substrate into contact with an immersion medium fluid is provided in an exposure tool or a wafer movement path from an exposure process to a PEB process. With the second immersion mechanism, according to the first method, a subset region whose inside is different from that of another unit exposure region in the contact history is moved in its predetermined layout on the substrate plane, thereby carrying out correction of the contact history. In this method, it is desirable that an area of the stacked resist films which comes into contact with the immersion medium fluid with the second immersion mechanism be sufficiently smaller than that caused by a mechanism which fills a projection optical system and its peripheral stacked resist films with the immersion medium fluid. In the case where an area of the second immersion mechanism is sufficiently small, it becomes further possible to attain advantageous effect of alleviating a the contact history distribution in the unit exposure region free of a defect in the adjacent unit exposure region.

A second method utilizes a mechanism which selectively fills only a predetermined region on the stacked resist films which an immersion lithography device has with the immersion medium fluid. As in the first method, according to the second method, in the predetermined layout on the substrate plane, a subset region whose inside is different from that of another unit exposure region in the contact history is moved, thereby carrying out correction of the contact history. In this method, a large area is provided to a mechanism which selectively fills only a predetermined region on the stacked resist films with the immersion medium fluid. Thus, in the above layout, it is desirable to carry out correction without substrate movement which is substantially similar to forming a latent image in a defective unit exposure region which is adjacent to a unit exposure region positioned at the periphery or without forming a latent image. The movement of the substrate which is required for correcting a change in the contact history due to a defect in the unit exposure region positioned in parallel to a relative moving direction of the substrate and the photomask may be short in distance with respect to an opposite direction to a unit exposure region targeted for correction of the contact history as compared with a case of forming a latent image in the defective unit exposure region. Specifically, with the mechanism which selectively fills only the predetermined region on the stacked resist films with the immersion medium fluid, a range or a wider range may be such that a part of the unit exposure region targeted for correction of the contact history brings into contact with the immersion medium fluid. In this case, considering an effect of diffusion and the like of developing immersion medium fluid in a development process, it is desirable that the substrate be moved in a distance which is longer than the range such that a part of the unit exposure region targeted for correction of the contact history brings into contact with the immersion medium fluid.

Now, a description will be given with respect to a third method. With respect to a unit exposure region whose number of unit exposure regions adjacent to the unit exposure region is obtained as a value other than a maximum value, a virtual unit exposure region is set so that the number of the adjacent unit exposure regions is obtained as a maximum value. When a mask pattern is transferred to the unit exposure region, a wafer is moved according to the unit exposure region and the virtual unit exposure region. The transfer of the mask pattern is carried out with respect to the unit exposure region only, and only substrate movement is carried out with respect to the virtual unit exposure region. As a result, the contact history in the unit exposure region which is the predetermined layout is obtained as a plurality of identical distributions or analogous distributions whose frequencies are substantially equal to each other. Therefore, the dimensional distributions in the unit exposure regions are substantially identical to each other regardless of the unit exposure region.

FIGS. 16 to 19 each show an example in which a virtual unit exposure region has been set in the case where the unit exposure region is as shown in FIG. 5. The virtual unit exposure region is laid out so that the number of the adjacent unit exposure regions relative to an exposure region is obtained as a maximum value except that the number of the adjacent unit exposure regions in a unit region is obtained as a maximum value. A liquid film of immersion medium fluid is formed with respect to the virtual unit exposure region, thereby correcting a distribution of the contact history values so as to be substantially equal to that of the contact history values in another exposure region. In the virtual unit exposure region, a pattern is not transferred. In FIGS. 16 to 19, a dotted region denotes the virtual unit exposure region.

Figure 16:
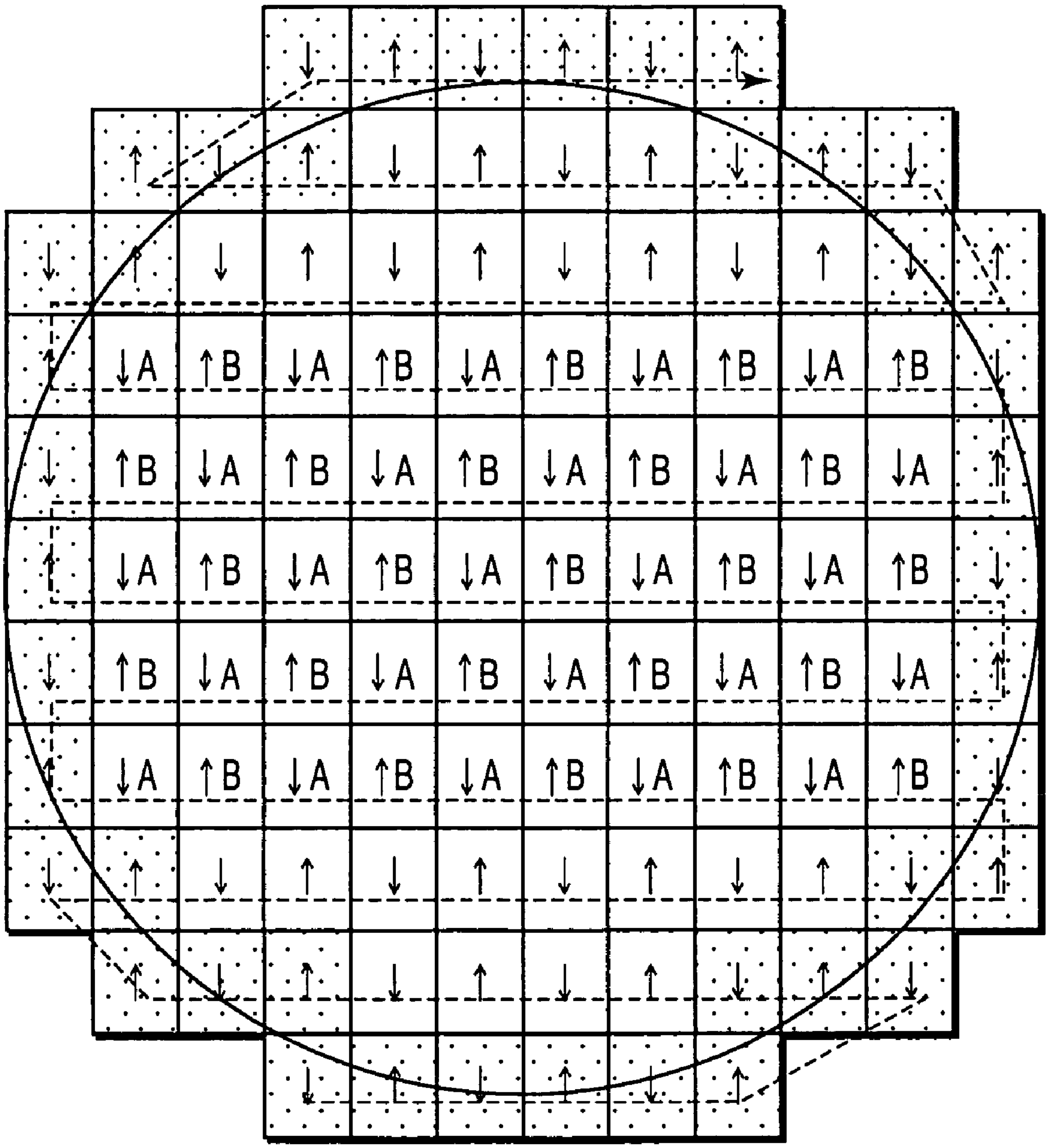
FIG. 16 is a shot map showing a unit exposure region on a wafer and a virtual unit exposure region, an exposure sequence of the unit exposure region, and a moving direction of an exposure field.

FIG. 16 shows an example in which a virtual unit exposure region has been set so that the number of the adjacent unit exposure regions is equal in each exposure region. It is possible to ensure that a contact history value distribution in the unit exposure regions adjacent to an outer periphery of a wafer is equal to that in the inside unit exposure region. However, in the unit exposure regions adjacent in the Y direction, a direction of substrate movement to move an exposure field may be identical to another one. A distribution difference between other unit exposure regions may occur depending on a target amount of the contact history in the unit exposure region.

Figure 17:
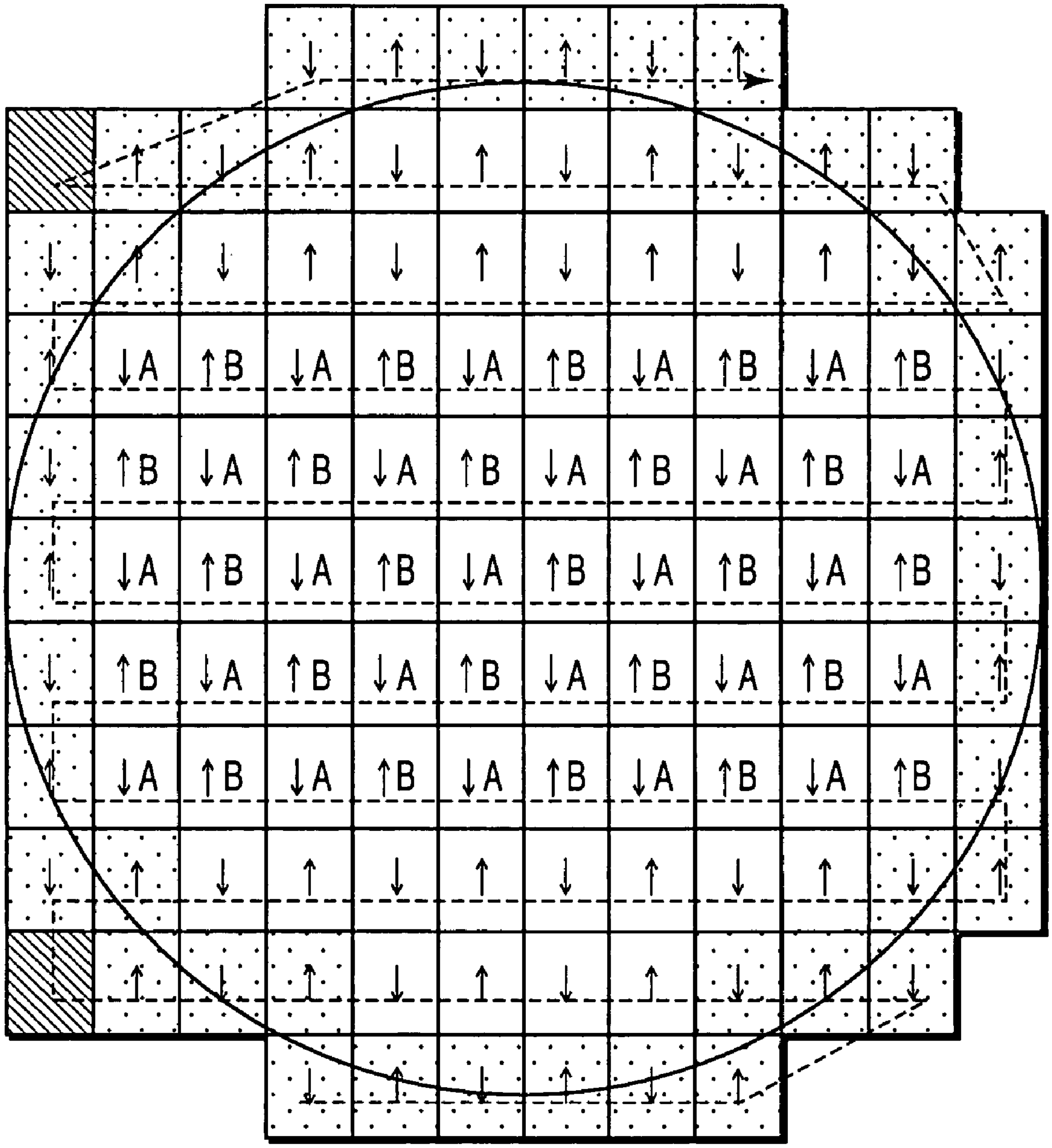
FIG. 17 is a shot map showing a unit exposure region on a wafer and a virtual unit exposure region, an exposure sequence of the unit exposure region, and a moving direction of an exposure field.

FIG. 17 shows a layout in which a modification has been further made. By adding shaded pseudo unit exposure regions, all the moving directions of the exposure field are made opposite to each other relative to the adjacent desired unit exposure regions in the Y direction. As a result, it becomes possible to reduce the distribution of the contact histories in the desired unit exposure region to a maximum of two types, depending on the target contact histories. In this example, although the pseudo unit exposure regions have been added, movement of a photomask which does not move with substrate operation is added, thereby making it possible to control all the relative moving directions of the adjacent unit exposure regions in the Y direction so as to be opposed to each other.

Figure 18:
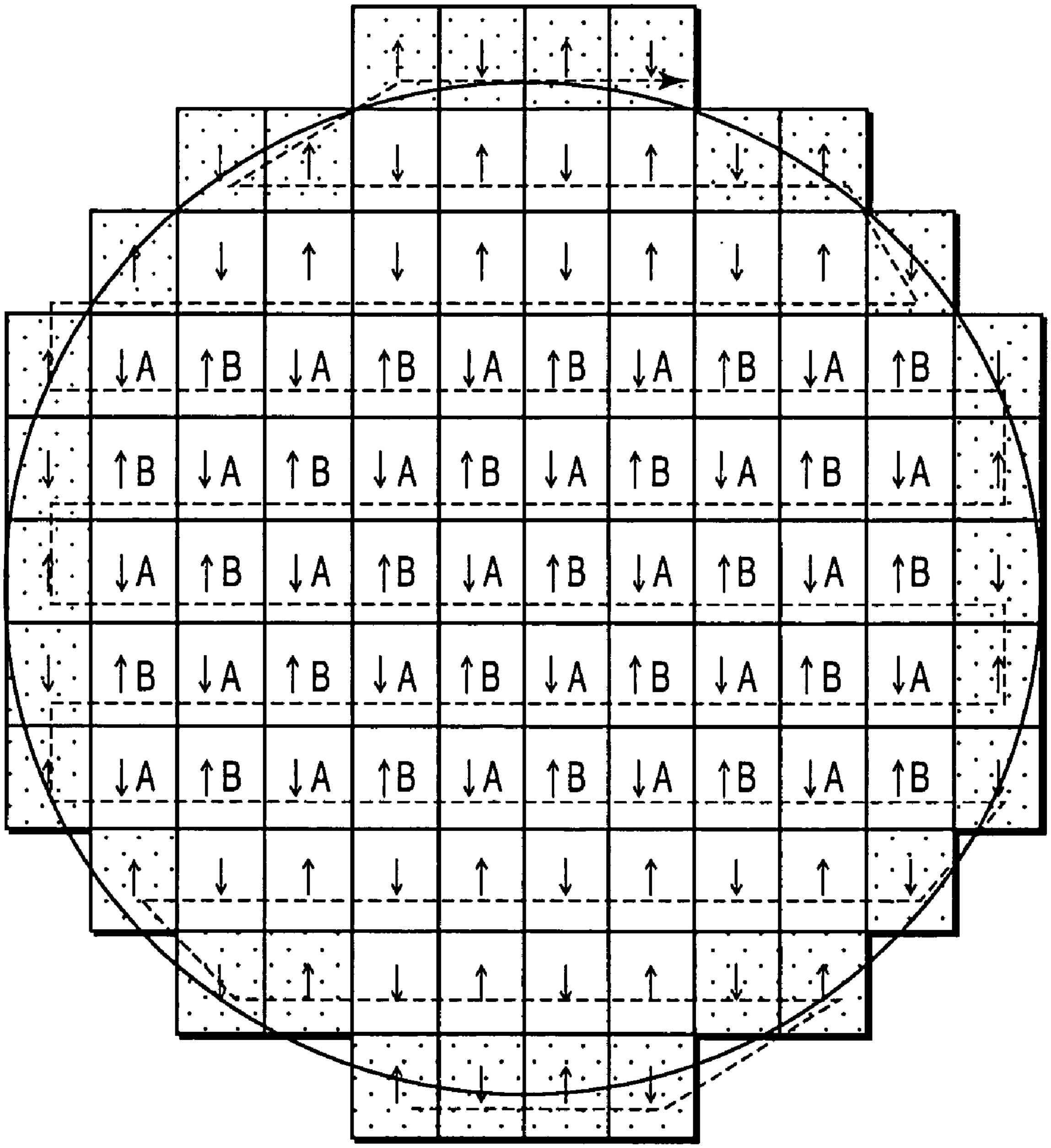
FIG. 18 is a shot map showing a unit exposure region on a wafer and a virtual unit exposure region, an exposure sequence of the unit exposure region, and a moving direction of an exposure field.

FIG. 18 shows an example in which the number of the adjacent unit exposure regions is not equal relative to all the unit exposure regions. In the case where there is no adjacent unit exposure region in the x, y, and oblique directions, adjacent virtual unit exposure regions are set in the x and y directions, but not in the oblique direction. The unit exposure region which conforms to the above-described condition is different from another unit exposure region in contact history. However, in the case where the size of a liquid film formed is substantially equal to that of the exposure field or in the case where dimensional precision of four corners in the unit exposure region may be low, the exposure time can be reduced as compared with the method shown in each of FIGS. 17 and 18.

Figure 19:
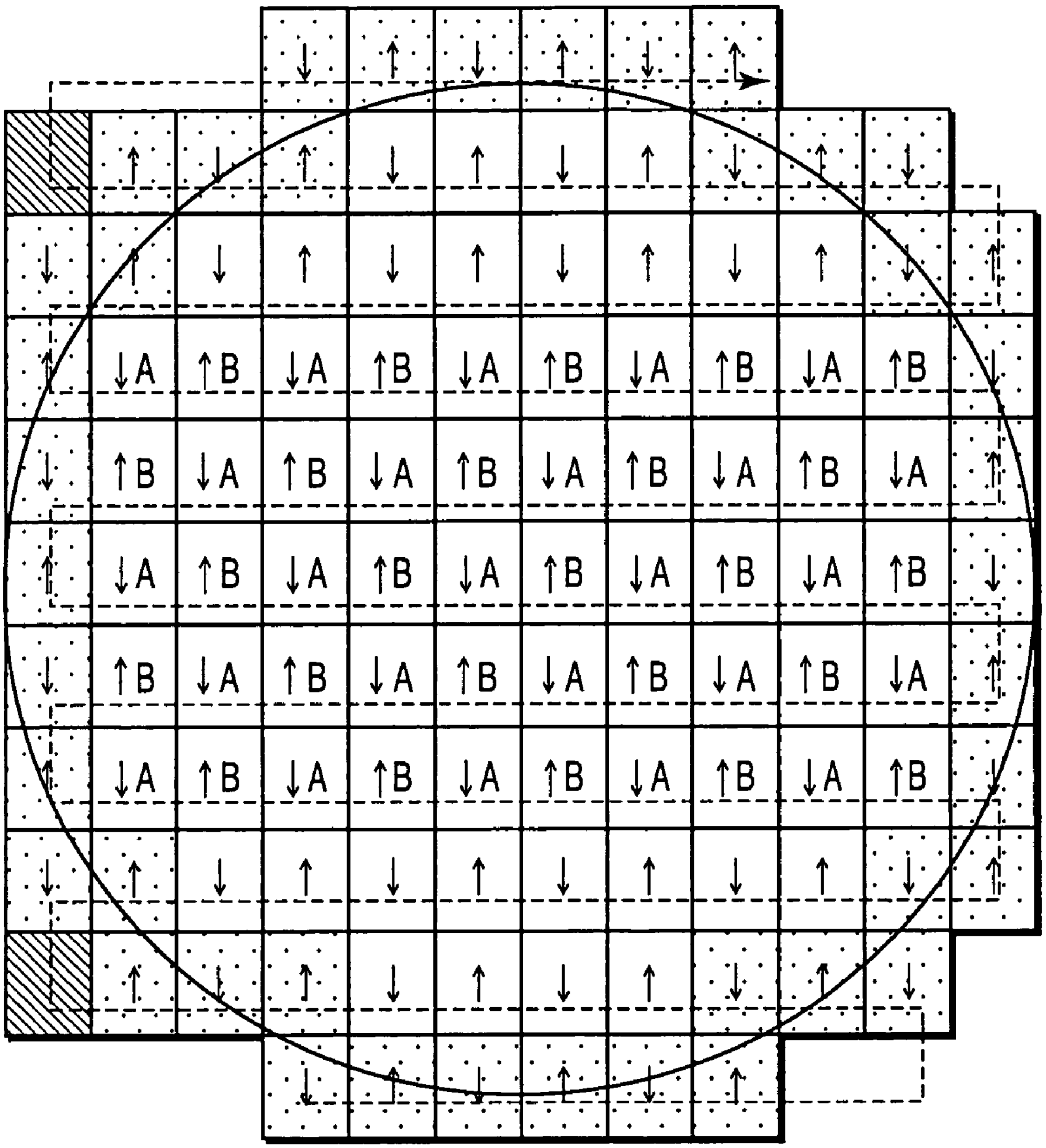
FIG. 19 is a shot map showing a unit exposure region on a wafer and a virtual unit exposure region, an exposure sequence of the unit exposure region, and a moving direction of an exposure field.

When the Y direction is moved in the layout of the unit exposure regions, a passage in which a relative moving distance of a substrate becomes minimal is not taken unlike in a routine process. As shown in FIG. 19, in the layout of unit exposure regions including a pseudo unit exposure region, outward movement in the X direction is carried out in amount equivalent to one unit exposure region, and then, movement in the Y direction is carried out. As a result, a contact history or dimensional change in the unit exposure region in the peripheral region due to relative movement in the oblique direction of the substrate can be restricted.

Although the above embodiments have introduced a layout in which the unit exposure regions are periodically laid out in orthogonal two-axis directions on the substrate, any other layout may be made. For example, three symmetrical layouts may be made. As an example, the unit exposure regions are periodically laid out at equal intervals in the X direction, and are laid out so that the period in the X direction is shifted on a half by half period basis every time one array is shifted in the Y direction.

In addition, the above embodiments have introduced a case in which a mechanism which selectively fills between an optical path and peripheral projection optical system and a stacked resist films with an immersion medium fluid is a rectangular shape whose one edge is parallel to relative movement of the photomask and substrate and the other edge is perpendicular thereto. However, advantageous effect of the present invention is not limited to the case in which the mechanism is formed in the rectangular shape.

Although the above embodiments have described a case in which a scan and repeat type immersion lithography device has been used, a step and repeat type immersion lithography device may be used.

It is preferable that the methods described in the above embodiments be applied to a process for manufacturing a semiconductor device.

According to the embodiments of the present invention, it is possible to improve dimensional precision of a resist pattern formed in an exposure technique which forms a liquid film in a local region on a resist film.

Next, a method of manufacturing a semiconductor device, by using immersion lithography as described in the above-described embodiments, will be explained.

Figure 20:
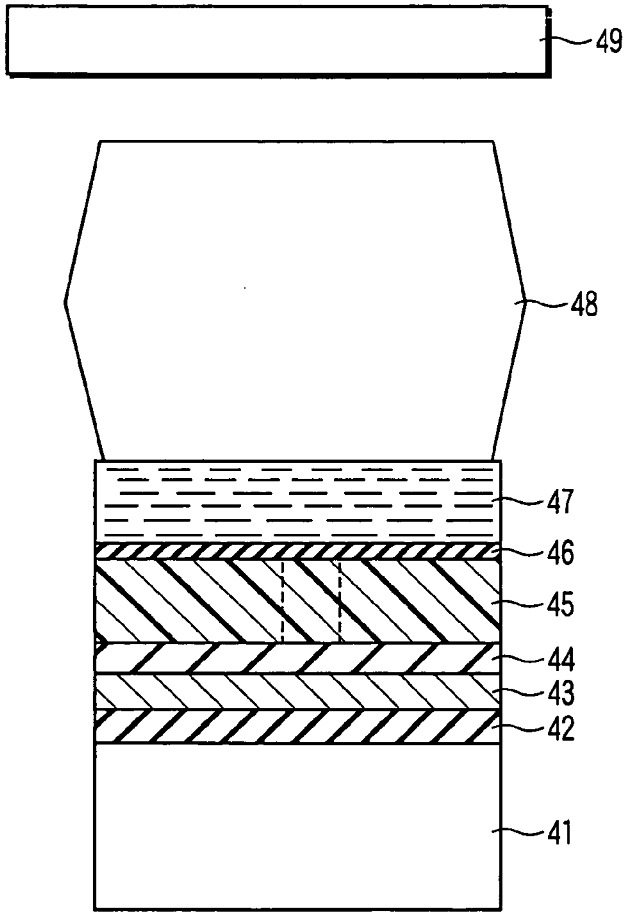
FIG. 20 is a cross sectional view showing a device structure in a step of a method of manufacturing a semiconductor device according to another embodiment of the present invention, which is used to explain the manufacturing method.

As shown in FIG. 20, on a silicon semiconductor substrate 41, a gate insulating film 42, a polysilicon film 43, a bottom anti-refelective layer 44, a resist film 45, a cover material film 46, are formed in the order.

The structure is then brought into an immersion lithography process. To be specific, above the semiconductor structure, a projection system 48 is provided, with an immersion medium fluid film 47 provided between a last element of the projection system 48 and the cover material film 46.

Figure 21:
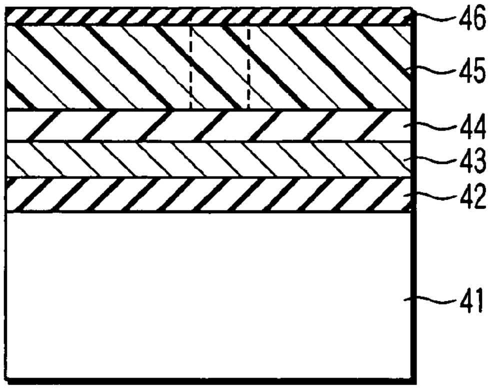
FIG. 21 is a cross sectional view showing a device structure in a step following to the step in FIG. 20 of the method of manufacturing the semiconductor device according to the embodiment of the present invention, which is used to explain the manufacturing method of the semiconductor device.

Next, a light ray is applied onto the semiconductor structure from a light source, not shown, through a photo mask 49 and the projection system 48 to make a latent image of a pattern on the resist film 45, as shown in FIGS. 20 and 21. The latent image is shown in broken line.

Figure 22:
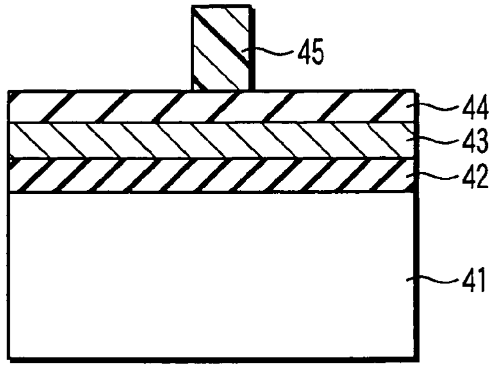
FIG. 22 is a cross sectional view showing a device structure in a step following to the step in FIG. 21 of the method of manufacturing the semiconductor device according to the embodiment of the present invention, which is used to explain the manufacturing method of the semiconductor device.

Subsequently, the latent image formed on the resist film 45 is developed to provide a resist pattern 45 corresponding the latent image, as shown in FIG. 22. At this process, the cover material film 46 is removed.

Figure 23:
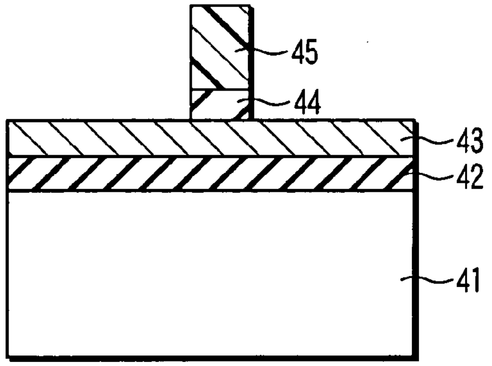
FIG. 23 is a cross sectional view showing a device structure in a step following to the step in FIG. 22 of the method of manufacturing the semiconductor device according to the embodiment of the present invention, which is used to explain the manufacturing method of the semiconductor device.

After that, the bottom anti-refelective layer 44 is subjected to an etching process, by using the resist pattern film 45 as a mask, to have a portion remained only under the resist pattern film 45, as shown in FIG. 23.

Figure 24:
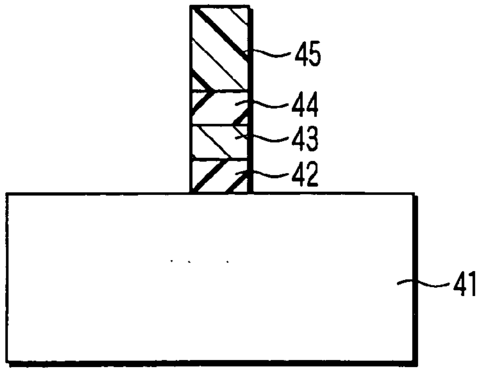
FIG. 24 is a cross sectional view showing a device structure in a step following to the step in FIG. 23 of the method of manufacturing the semiconductor device according to the embodiment of the present invention, which is used to explain the manufacturing method of the semiconductor device.

Further, the polysilicon film 43 and gate insulating film 42 are subjected to an etching process, by using the resist pattern film 45 as a mask, so that the polysilicon film 43 and gate insulating film 42 remain only under the resist pattern film 45, as shown in FIG. 24. With the manufacturing method, a semiconductor device with high accuracy is manufactured.

According to the embodiments of the present invention, it is possible to improve dimensional precision of a resist pattern formed in an exposure technique which forms a liquid film in a local region on a resist film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of generating a writing pattern which generates, from pattern data, writing pattern data to write a mask pattern in a photomask used in an exposure tool comprising a projection optical system to transfer the mask pattern to a resist film formed on a substrate to form a latent image, an immersion mechanism which forms a liquid film in a local region including a region between the last element of the projection optical system and the resist film, and a movement mechanism which moves the substrate with respect to the projection optical system and the immersion mechanism to transfer the mask pattern to a plurality of unit exposure regions set in the resist film, the method comprising:

obtaining a typical distribution of contact history values between the resist film and the liquid film in the unit exposure region;

dividing a pattern which corresponds to the pattern data into a plurality of regions according to the typical distribution of the contact history values; and carrying out correction of a pattern included in each of the divided regions under a rule according to the contact history values.

2. A method of generating a writing pattern, according to claim 1, further comprising obtaining a plurality of distributions of contact history values between the resist film and the liquid film in a plurality of the unit exposure regions, wherein the typical distribution of contact history values is obtained from the plurality of distributions of contact history values.

3. A method of generating a writing pattern, according to claim 2, further comprising obtaining a latent image formed in the resist film or a size change of a pattern obtained by developing the resist film in each of the regions in which the plurality of distributions of contact history values are different from each other, when the plurality of distributions of contact history values are different from each other according to the unit exposure regions, wherein the contact history values in the typical distribution corresponding to the regions in which the plurality of distributions of contact history values are different from each other is made to correspond to the contact history values in the region where the size change of the pattern is large.

4. A method of generating a writing pattern, according to claim 3, wherein each of the contact history values in the region where the size change of the pattern is large is a maximum value or a minimum value.

5. A method of generating a writing pattern, according to claim 2, further comprising obtaining a latent image formed in the resist film or a size change of a pattern obtained by developing the resist film in each of the regions in which the plurality of distributions of contact history values are different from, when the plurality of distributions of contact history values are different from each other according to the unit exposure regions, wherein the contact history values in the typical distribution corresponding to the regions in which the plurality of distributions of contact history values are different from each other is made to correspond to an average value of the contact history values, when the size change of the pattern changes substantially monotonously according to the contact history values.

6. A method of generating a writing pattern, according to claim 2, further comprising obtaining a distribution of the contact history values in each of the unit exposure regions unit, when the plurality of distributions of contact history values are different from each other according to the unit exposure regions, wherein a distribution in which the number of unit exposure regions being the same distribution is maximum is defined as the typical distribution of the contact history values.

7. A method of generating a writing pattern, according to claim 6, wherein, when a plurality of the distributions in which the number of unit exposure regions being the same distribution is maximum exist, the typical distribution of the contact history values is made to correspond to an average of the distributions in which the number of unit exposure regions being the same distribution is maximum.

8. A method of generating a writing pattern, according to claim 2, further comprising obtaining a distribution of the contact history values in each of the unit exposure regions unit, when the plurality of distributions of contact history values are different from each other according to the unit exposure regions, wherein the typical distribution of the contact history values is made to correspond to an average of top four in frequencies of the distributions in which the number of unit exposure regions being the same distribution is maximum.

9. A method of generating a writing pattern, according to claim 2, wherein, when the plurality of distributions of contact history values are different from each other according to the unit exposure regions, the typical distribution of the contact history values is made to correspond to a distribution of the contact history values of a unit exposure region whose number of unit exposure regions adjacent to the unit exposure region is maximum.

10. A method of generating a writing pattern, according to claim 9, wherein, when a plurality of the distribution of the contact history values of a unit exposure region whose number of unit exposure regions adjacent to the unit exposure region is maximum exist, the typical distribution of the contact history values is made to correspond to an average of the distribution of the contact history values of the unit exposure region whose number of unit exposure regions adjacent to the unit exposure region is maximum.

11. A method of generating a writing pattern, according to claim 1, wherein the contact history values include at least one item of information of a time of contact between the liquid film and the resist film, a count of contact between the liquid film and the resist film, a quantity of the liquid film, an impulse applied to a surface of the resist film in accordance with a flow of the liquid film, and a maximum frictional force of a surface of the resist film with respect to the liquid film.

12. A method of generating a writing pattern, according to claim 1, wherein the contact history values are contact history values before and/or after forming a latent image in the exposure process.

13. A method of forming a resist pattern, comprising:

transferring a mask pattern on a resist film formed on a substrate by using an exposure tool comprising a projection optical system to transfer the mask pattern to the resist film formed on the substrate, a first immersion mechanism which forms a liquid film in a local region including a region between the projection optical system and the resist film, and a stage which horizontally moves the substrate relatively with respect to the projection optical system and the first immersion mechanism to transfer the mask pattern to a plurality of unit exposure regions set in the resist film; and developing the resist film on which the mask pattern is transferred, wherein a correction is carried out on a distribution of contact history values between the resist film and the liquid film in the unit exposure regions to be made substantially equal to the distribution of contact history values in another unit exposure region.

14. A method of forming a resist pattern, according to claim 13, the correction is carried out in a manner that the first immersion mechanism and the stage are driven, without transferring the mask pattern on the resist film.

15. A method of forming a resist pattern, according to claim 13, wherein the correction is carried out by:

preparing a second immersion mechanism which forms a liquid film having an area smaller than that of a liquid film formed by the first immersion mechanism; and moving the second immersion mechanism relatively with respect to the substrate, while forming a liquid film in a local region on the resist film by using the second immersion mechanism.

16. A method of forming a resist pattern, according to claim 13, wherein the correction is carried out in a manner that, with regard to a unit exposure region whose number of unit exposure regions adjacent to the unit exposure region is a value other than a maximum value, a virtual unit exposure region is set so that the number of the adjacent unit exposure regions becomes the maximum value, and the liquid film is formed on the virtual unit exposure region by using the first immersion mechanism, without transferring the mask pattern onto virtual unit exposure region.

17. A method of manufacturing a semiconductor device, comprising:

forming a photo mask based on a writing pattern generated by using the method of generating a writing pattern, as claimed in claim 1; and transferring a mask pattern formed on the photo mask on a resist film formed on a semiconductor substrate to form a latent image.

18. A method of manufacturing a semiconductor device, comprising:

transferring a mask pattern formed on a photo mask on a resist film formed on a semiconductor substrate by using the method of forming a resist pattern, as claimed in claim 13, to form a latent image.

* * * * *